United States Patent [19]

Petroff et al.

[11] Patent Number: 5,013,683
[45] Date of Patent: May 7, 1991

[54] METHOD FOR GROWING TILTED SUPERLATTICES

[75] Inventors: Pierre M. Petroff; Herbert Kroemer, both of Santa Barbara, Calif.

[73] Assignee: The Regents of the University of California, Berkeley, Calif.

[21] Appl. No.: 300,266

[22] Filed: Jan. 23, 1989

[51] Int. Cl.$^5$ ............................................. H01L 21/20
[52] U.S. Cl. ........................... 437/110; 148/DIG. 25; 148/DIG. 97; 148/DIG. 160; 148/DIG. 169; 156/610; 437/107; 437/133; 437/936
[58] Field of Search ................... 148/DIG. 17, 25, 41, 148/48, 56, 65, 57, 72, 97, 110, 160, 169; 156/610–614; 427/255.1, 248.1; 437/81, 105, 107, 108, 110, 112, 126, 133, 936, 939, 946, 976

[56] References Cited

U.S. PATENT DOCUMENTS 4,058,430 11/1977 Suntola et al. ...................... 156/611

OTHER PUBLICATIONS

Tanaka et al., "Interface Roughness of GaAs-AlAs Quantum Wells...", J. Appl. Phys. 64(9), Nov. 1, 1988, pp. 4503–4508.
Sakaki et al., "One Atomic Layer Hetero Interface Fluctuations in GaAs-AlAs . . . ", Jpn. J. Appl. Phys., vol. 24, Jun. 1985, pp. L417–L420.
Briones et al., "Low-Temperature Growth of AlAs/-GaAs Heterostructures . . . ", Jpn. J. Appl. Phys., vol. 26, No. 7, Jul. 1987, pp. L1125–L1127.
Chang et al., "The Growth of a GaAs–GaAlAs Superlattice", J. Vac. Sci. Technol., vol. 10, No. 1, Jan./Feb. 1973, pp. 11–16.

Primary Examiner—Olik Chaudhuri
Assistant Examiner—William Bunch
Attorney, Agent, or Firm—Donald A. Streck

[57] ABSTRACT

A method for growing a superlattice structure on a substrate. First, a periodic array of monoatomic surface steps are created on the surface of the substrate at an area to have the superlattice structure grown thereon. There is apparatus for creating a beam of a material being input thereto and for selectively including or not including respective ones of a plurality of materials within the beam. The beam is directed at the steps of the substrate. Finally, logic causes control apparatus to include and not include respective ones of the materials within the beam in a pre-established pattern of time periods which will cause the materials to be deposited on the steps in a series of stacked monolayers. Tilted Superlattices (TSLs) and Coherent Tilted Superlattices (CTSLs) are created. The method can create pseudo ternary semiconductor alloys as part of a CTSL by employing at least two binary compound semiconductor alloys in the deposition process. It can also create a quantum wire superlattice by sandwiching a thin CTSL layer between two wider band gap layers. Additionally, it can create a tilted superlattice with zero misfit strain by using three binary compounds to produce a pseudoternary compound in a direction parallel to the substrate normal while the tilted superlattice structure provides a desired band gap in a direction parallel to the substrate surface. One may form the CTSL as part of a field effect transistor (FET) wherein the CTSL is part of the FET gate or form the CTSL as the cladding layers of a quantum wire laser having a GaAs active layer.

33 Claims, 6 Drawing Sheets

METHOD FOR GROWING TILTED SUPERLATTICES

BACKGROUND OF THE INVENTION

This invention was made with Government support under Contract No. AFOSR-88-0334 awarded by the Air Force. The Government has certain rights in this invention.

This invention relates to the growing of superlattice structure and, more particularly, to a method for growing a superlattice structure on a substrate comprising the steps of, creating a periodic array of monoatomic surface steps on the substrate comprised of a plurality of equal and adjacent monoatomically thick steps on the surface of the substrate at an area to have the superlattice structure grown thereon; providing means for creating a beam of a material being input thereto and control means operably connected for selectively including or not including respective ones of a plurality of materials within the beam; directing the beam at the steps of the substrate; and, causing the control means to include and not include respective ones of the materials within the beam in a pre-established pattern of time periods which will cause the materials to be deposited on the steps in a series of stacked monolayers.

Figure 1:
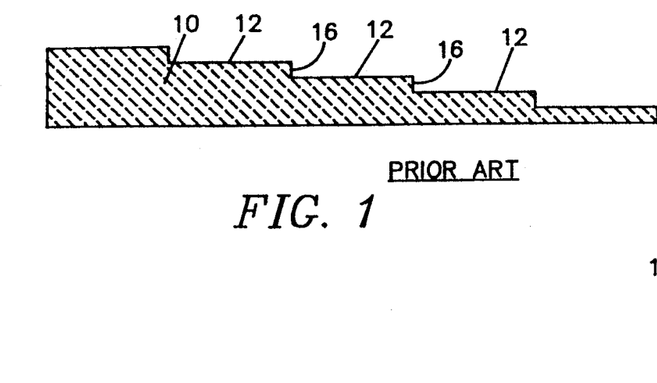
FIG. 1 is a simplified cutaway end view of a substrate prepared for the forming of a superlattice thereon according to the prior art.
Figure 2:
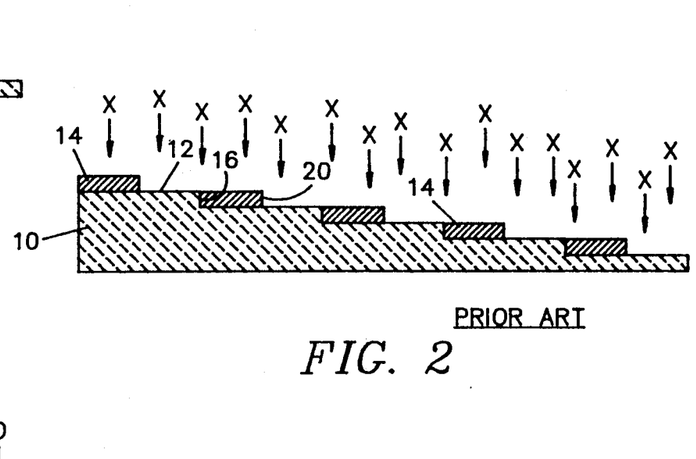
FIG. 2 is a simplified drawing of the substrate of FIG. 1 in the process of forming a superlattice thereon according to the prior art during the deposition of a first material of a first layer.

This invention is an improvement to the basic technology of U.S. Pat. No. 4,591,889 issued May 27, 1986, of which co-inventor Pierre M. Petroff, hereof was a co-inventor. That patent entitled SUPERLATTICE GEOMETRY AND DEVICES, as the title suggests, was to the basic geometry of a superlattice structure and possible devices of a general nature that could be constructed with such a geometry. The patent suggests that the geometry of the structure could be grown employing molecular beam epitaxy equipment and techniques as known in the art. In particular, the teaching of that patent is shown in simplified form in FIGS. 1-4 hereof. As depicted in FIG. 1, a substrate 10 having equal and periodic steps 12 on the upper surface thereof is first formed. It is suggested that a buffer layer of a substrate-like material may be grown on the steps 12 to improve the texture of the steps. The materials comprising the layers are then deposited on the steps 12 in the manner of FIGS. 2 and 3. As depicted in FIG. 2, the first material 14 (indicated by the X's) is grown through a molecular beam epitaxial process. The amount of the first material 14 grown in each step 12 is suggested as being controlled by use of a shutter system t block the source of the molecular beam of the first material. As taught in that patent, the deposited atoms of the first material 14 tend to migrate to the edges 16 of the steps 12 and, therefore, form a first region on each step 12 adjacent the edge 16. The depth of the region of the first material 14 is controlled by the amount of the first material 14 which is grown on each step 12. This, of course, is a function of the amount of time the "shutter" controlling material 14 is open.

Figure 3:
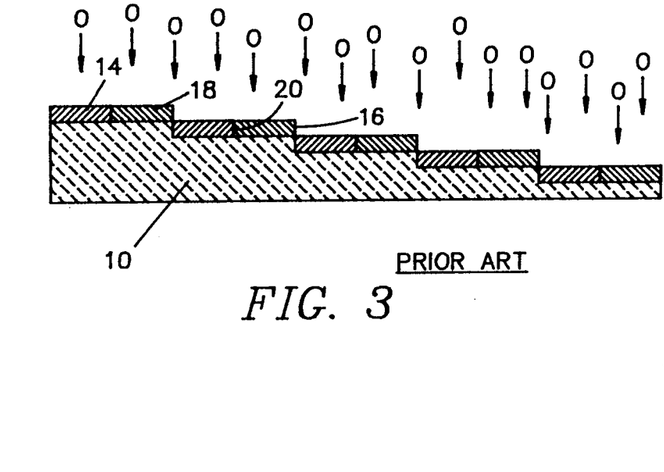
FIG. 3 is a simplified drawing of the substrate of FIG. 1 in the process of forming a superlattice thereon according to the prior art during the deposition of a second material of a first layer.
Figure 4:
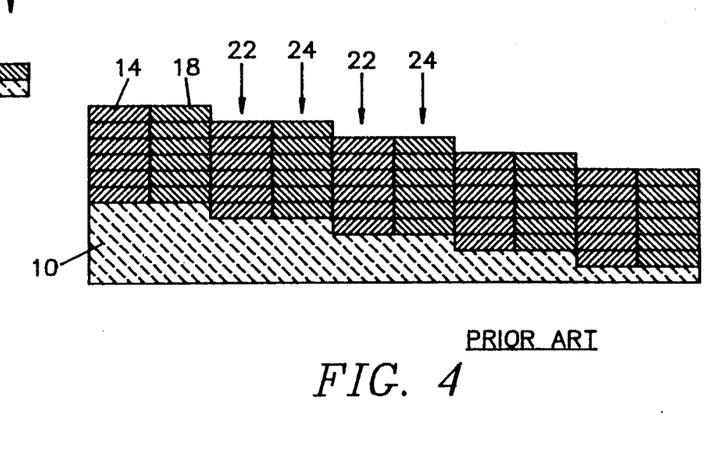
FIG. 4 is a simplified drawing of the substrate of FIG. 1 after the process of forming a superlattice thereon according to the prior art depicting the multiple layers thereof.

As depicted in FIG. 3, the second material 18 (indicated by the O's) is also grown through a molecular beam epitaxial process. The amount of the second material 18 grown on each step 12 is also controlled by use of a shutter system to block the source of the molecular beam of the second material. Again as taught in that patent, the deposited atoms of the second material 18 tend to migrate to edges—in this case, the edges 20 of the first material 14—and, therefore, form a second region on each step 12 adjacent the first material 14. The depth of the region of the second material 18 is also controlled by the amount of the second material 18 which is grown on each step 12 which, again, is a function of the amount of time the "shutter" controlling material 18 is open.

Each layer or region of the first and second material 14, 18 as depicted in FIGS. 2 and 3 is actually only a few angstroms (Ås) thick. The process of growing layers comprised of the first and second regions of the materials 14, 18 is repeated until vertical layers 22 and 24 of the materials 14, 18, respectively, are created. As also taught in that patent, by varying the widths of the regions with respect to the width of the steps, the layers 22, 24 can be made to tilt. Thus, if the widths or thicknesses of the layers are designated as m and n and the width of the steps is considered as 1, the layer, 22, 24 will be vertical if $m+n$ is close to 1. As can be appreciated from FIGS. 3 and 4, if $m+n>1$, the material 18 layer of each step 12 will overlap the material 14 layer of the next adjacent lower step 12 slightly as the figures are viewed. As repeated layers of the same dimensions are grown, it an be seen that the layers 22, 24 will tilt to the right as the figures are viewed. In addition to the formation of vertical and tilted superlattice structures, the patent also suggests the formation of quantum well wires, for example, by combining solid layers with vertical or tilted layers so that a transverse conductive layer (i.e. a quantum well wire) is formed being contained on all sides by materials into which no electrical flow can occur. The patent also suggests a possible structure according to the invention disclosed therein which, when pumped, yields as solid state laser lasing at more than one frequency.

The teachings of the above-referenced prior art patent suffer from only one shortcoming—they reflect theoretical structures and methods of forming them; in other words, while the superlattice structures disclosed therein are useful and the inventors herein have found that they can, in fact, be produced using molecular beam epitaxy equipment, the techniques known in the art at the time of the invention for the use of such equipment when applied to producing superlattice structures in the manner suggested by the invention proved to be less than ideal. Since those structures were never produced by the inventors of the above-referenced patent, the best mode for carrying out the invention was merely a best guess based on technology known to the inventors at the time and previously employed by them for other purposes. The structures produced experimentally by the inventors herein starting with the teachings of that patent, while suitable for laboratory testing and proving the viability of the concept, were less than suitable for commercial production of devices employing such superlattice structures and geometry therein.

Wherefore, it is an object of the present invention to provide methods for the growing of superlattice structures which can be used for producing solid state devices incorporating superlattice geometries therein which are practical for commercial production purposes.

It is another object of the present invention to provide methods for the growing of superlattice structures which can be used for producing solid state devices incorporating superlattice geometries therein in which the parameters of the grown layers can be accurately controlled.

It is still another object of the present invention to provide methods for the growing of superlattice structures which can be used for producing solid state devices incorporating superlattice geometries therein in which the quality and separation of materials comprising the grown layers can be closely controlled.

Other objects and benefits of the present invention will become apparent from the detailed description which follows hereinafter when taken in conjunction with the drawing figures which accompany it.

SUMMARY

The foregoing objects have been achieved in the method of the present invention for growing a superlattice structure on a substrate by depositing elements thereon in a stacked series of monolayers comprising the steps of, creating a periodic array of monoatomic surface steps on the substrate comprised of a plurality of equal and adjacent monoatomically thick steps on the surface of the substrate at an area to have the superlattice structure grown thereon; providing means for creating a beam containing the elements to be deposited and control means operably connected for selectively including or not including respective ones of the elements within the beam; directing the beam at the steps of the substrate; and, causing the control means to include and not include respective ones of the elements within the beam in a pre-established pattern of time periods which will cause the elements to be deposited on the steps in a series of stacked monolayers.

In one embodiment wherein Al, Ga, and As are to be deposited on a substrate to form stacked monolayers of AlAs and GaAs, the step of causing the control means to include and not include respective ones of the elements within the beam in a pre-established pattern of time periods includes the steps of:

(a) first depositing sufficient atoms of Al to form an Al monolayer;
(b) next depositing sufficient atoms of As to combine with the Al monolayer to form an AlAs monolayer;
(c) then depositing sufficient atoms of Ga to form a Ga monolayer adjacent the Al monolayer;
(d) next depositing sufficient atoms of As to combine with the Ga monolayer to form a GaAs monolayer; and,
(e) repeating steps (a) through (d) until the desired thickness of stacked monolayers has been grown.

In another embodiment for the same purpose, the same step includes the steps of:

(a) first depositing sufficient atoms of Al to form an Al monolayer;
(b) then depositing sufficient atoms of Ga to form a Ga monolayer adjacent the Al monolayer;
(c) next depositing sufficient atoms of As to combine with the Al and Ga monolayers to form AlAs and GaAs monolayers; and,
(d) repeating steps (a) through (c) until the desired thickness of stacked monolayers has been grown.

In a third and preferred embodiment, the step includes the steps of:

(a) starting the simultaneous depositing of Al and Ga atom to form adjacent Al and Ga monolayers;
(b) stopping the depositing of Al when sufficient atoms of Al have been deposited to form the desired Al monolayer;
(c) stopping the depositing of Ga when sufficient atoms of Ga have been deposited to form the desired Ga monolayer;
(d) next depositing sufficient atoms of As to combine with the Al and Ga monolayers to form AlAs and GaAs monolayers; and,
(e) repeating steps (a) through (d) until the desired thickness of stacked monolayers have been grown.

The preferred method of the later embodiment additionally comprises between steps (c) and (d) thereof the step of delaying for a period of time sufficient to allow Al and Ga atom migration within each of the monolayers.

A preferred result is achieved where each step contains a plurality of atomic bonding sites on the surface thereof and the method additionally includes the step of establishing the time periods for deposition of the elements for each of the monolayers such that the total number of atoms of the elements deposited is equal in number to the number of the atomic bonding sites whereby a Coherent Superlattice (CSL) is formed.

In one version of the method, there are a pair of monolayer formed by a pair of elements A and B on each step and the method additionally comprises the step of making the width m of element A plus the width n of element B less than or equal to the width p of the step whereby the stacked monolayers form layers of elements A and B which are normal to the substrate.

In another version of the method, there are a pair of monolayer formed by a pair of elements A and B on each step and the method additionally comprises the step of making the width m of element A plus the width n of element B greater than the width p of the step whereby the stacked monolayers form layers of elements A and B which are tilted from being normal to the substrate thus forming a Coherent Tilted Superlattice (CTSL).

The method can create pseudo ternary semiconductor alloys as part of the CTSL by employing at least two binary compound semiconductor alloys in the deposition process. It can also create a quantum wire superlattice by sandwiching a thin tilted superlattice layer between two wider band gap layers. Additionally, it can create a tilted superlattice with misfit strain by using three binary compounds to produce a pseudo-ternary compound in a direction parallel to the substrate normal while the tilted superlattice structure provides a desired band gap in a direction parallel to the substrate surface. With respect to specific devices, one may form the CTSL as part of a field effect transistor (FET) wherein the CTSL is part of the FET gate or form the CTSL as the cladding layers of a quantum wire laser having a GaAs active layer.

DESCRIPTION OF THE PREFERRED EMBODIMENT

The body of work upon which this invention is based uses III-V compound semiconductor material. As those skilled in the art will readily recognize and appreciate, however, the concept is general enough to be applied to other crystalline materials such as metals and ceramics. It is therefore the inventors' intent that the breadth accorded the disclosure that follows and the claims appended hereto be in keeping with the scope and spirit of the invention disclosed herein.

As mentioned above, this invention comprises further refinements and practical methods of production of a basic structural geometry disclosed and claimed in above-referenced U.S. Pat. No. 4,591,889, the teachings of which are incorporated herein by reference in the interest of simplicity and brevity and the avoidance of redundancy.

In working with superlattice structures and methods for their practical production starting from the limited teachings of the '889 patent, the inventors herein found and determined that the growth of tilted superlattices (with vertical superlattices merely being a special case thereof) involved the following:

(1) Use of a vicinal surface composed of a periodic array of steps. These surfaces can best be obtained by polishing a substrate a few degrees (0.5 to 4 degrees) off a major crystallographic $\{100\}$, $\{110\}$, or $\{111\}$. The substrate should be a single crystal and the surface steps should be monoatomic in height.

(2) The deposition of fraction of monolayers, m and n, of two semiconductors, A and B, with different composition and band gap. In the inventor's case, the primary materials employed were GaAs and $Al_xGa_{1-x}As$ with $0<x<1$. The fraction of monolayers m and n of the two semiconductors A and B should satisfy the conditions: $m,n<1$ with the tilt parameter, $p=m+n \sim 1$.

(3) The growth regime should be a layer growth mode and the layer nucleation should take place at step edges.

(4) All the fractional monolayers deposited should grow in phase; that is, all steps' motion during growth should move laterally with the same velocity.

The description which now follows describes the methods which the inventors herein have actually employed to satisfy the above-listed conditions and grow tilted superlattices such as those postulated by the '889 patent. Also described are novel extension of the tilted superlattice concept of the '889 patent for: the obtention of pseudo-ternary alloys out of binary compound semiconductors, the obtention of quantum wire superlattices, the growth of strained layers tilted superlattices, and the coherent tilted superlattice.

Figure 5:
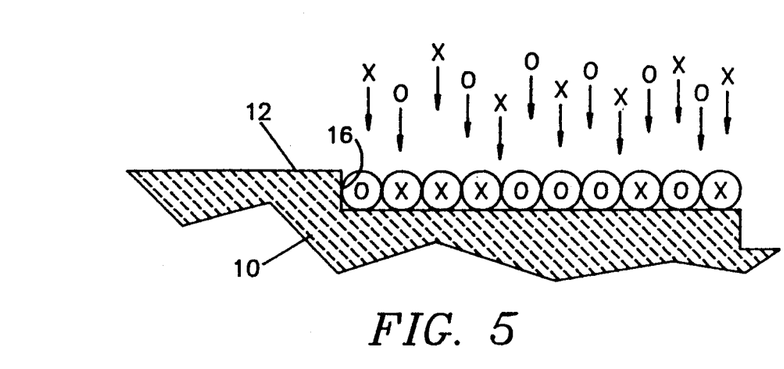
FIG. 5 is an enlarged, simplified drawing of one step of a stepped substrate employed in the present invention during the process of forming a superlattice according to the methods of the present invention in a preferred embodiment depicting how the materials are simultaneously deposited randomly on the step.
Figure 6:
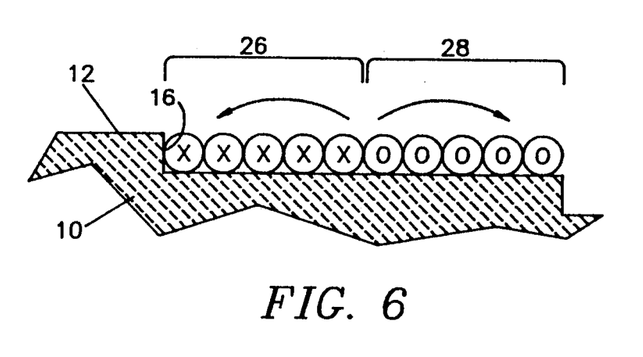
FIG. 6 is a drawing depicting how the materials separate and migrate respectively to front and back sides of the step when practicing the preferred method of the present invention started in FIG. 5.

Before continuing with the details of the present invention, reference should be made to the enlarged, simplified drawings of FIGS. 5 and 6 to understand a physical phenomenon employed by the inventors in their preferred method of structural growth. For simplicity, only the activity at one step is shown. Also, it should be mentioned at this point that the description that follows concentrates on Molecular Beam Epitaxy (MBE) apparatus and methods of operation. As those skilled in the art will readily appreciate, the process to be described can be accomplished by other apparatus known in the art as well as apparatus under development or, perhaps, not even yet contemplated. One example would be Metal Organic Chemical Vapor Deposition (MOCVD) apparatus. The precise equipment employed should not be considered as a limiting factor of the present invention. MBE apparatus and methods are employed for disclosure purposes only because that is the equipment employed by the inventors herein in their experiments that lead to the present invention.

As depicted in FIG. 5, each preferred step 12 is monoatomic in thickness. If two materials (symbolized by the X's and O's) are deposited simultaneously in an amount to fill the step 12 with atoms of the two materials sufficient to form the two desired monolayers as depicted in FIG. 5, the atoms will migrate into the monolayers 26 and 28 in the manner depicted by the arrows in FIG. 6. This, of course, assumes the proper growing conditions of temperature and the like.

Figure 7:
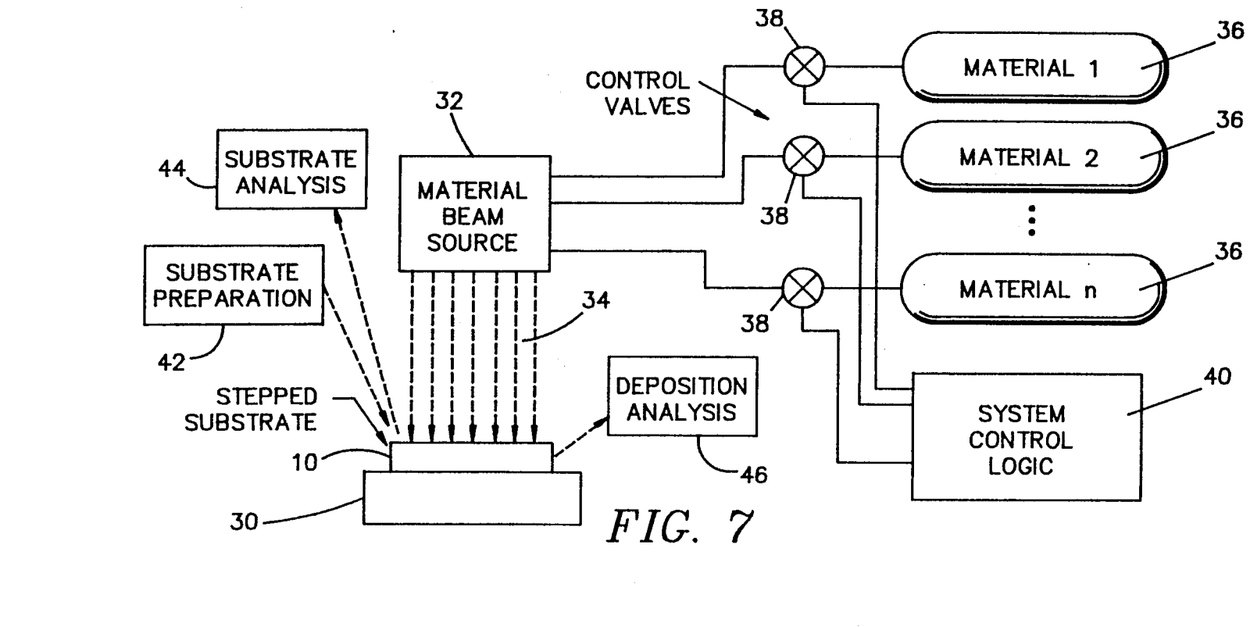
FIG. 7 is a simplified functional block diagram of apparatus for growing superlattice structures according to the various methods of the present invention.

Turning now to FIG. 7, apparatus which can be employed for practicing the various methods of the present invention is depicted in simplified form therein. For convenience, simplicity, and the avoidance of unnecessary features which are not points of novelty to the present invention, aspects well known to those skilled in the art such as vacuum chambers, airlocks, and the like, have been omitted from the drawing. As is typical in such applications, there is a stage 30 for holding the stepped substrate 10 in place. There is a source 32 for creating an atomic beam 34 (or similar beam depending on the apparatus being used) containing the atoms of the materials to be grown on the substrate 10. As mentioned earlier, the source 32 can be MBE or MOCVD or Chemical Beam Epitaxy (CBE) apparatus, or any other appropriate equipment. The beam 34 is formed of materials (such as elements Al, As, Ga, etc., as appropriate) from the supply sources 36. The materials from the supply sources 36 pass through individually controllable apparatus such as shutters, valves, or the like, as appropriate to the particular apparatus being used to create the beam 34. For ease of representation only, this apparatus is represented by the control valves 38. The important aspect relative to the present invention is that each of the valves 38 controls the presence of one of the materials in the beam 34 and, additionally, the valves 38 are each individually connected to system control logic 40 to be controlled thereby. Thus, with respect to apparatus employed to practice the methods of the present invention, all of the materials to be used in the growth process must be controlled individually by the logic 40 according to logic steps now to be described.

In forming a layer of, for example, GaAs on a substrate in the prior art, it is common to direct a beam of Ga and As onto the substrate. As they form a molecular bond to the surface of the substrate, the Ga and As also bond to one another to form the desired GaAs. The inventors herein departed radically from that prior art approach to achieve their desired objectives. This is because of the behavioral phenomenon described earlier with respect to FIGS. 5 and 6. Thus, it was found to provide more desirable results if, for example, the Ga and Al were first applied to form the monolayers 26, 28 in an optimum manner and then the As was added. Since we are talking here about monoatomic layers, there is no potential problem of surface penetration to lower levels by the As there would be in a doping operation requiring much deeper penetration into a previously deposited material. The inventors found that there were, in fact, three ways to accomplish this approach and achieve their objectives with acceptable results. These three approaches will now be described with respect to possible logic to be included within the control logic 40 and the signals to be employed to regulate the composition of the beam 34.

Figure 8:
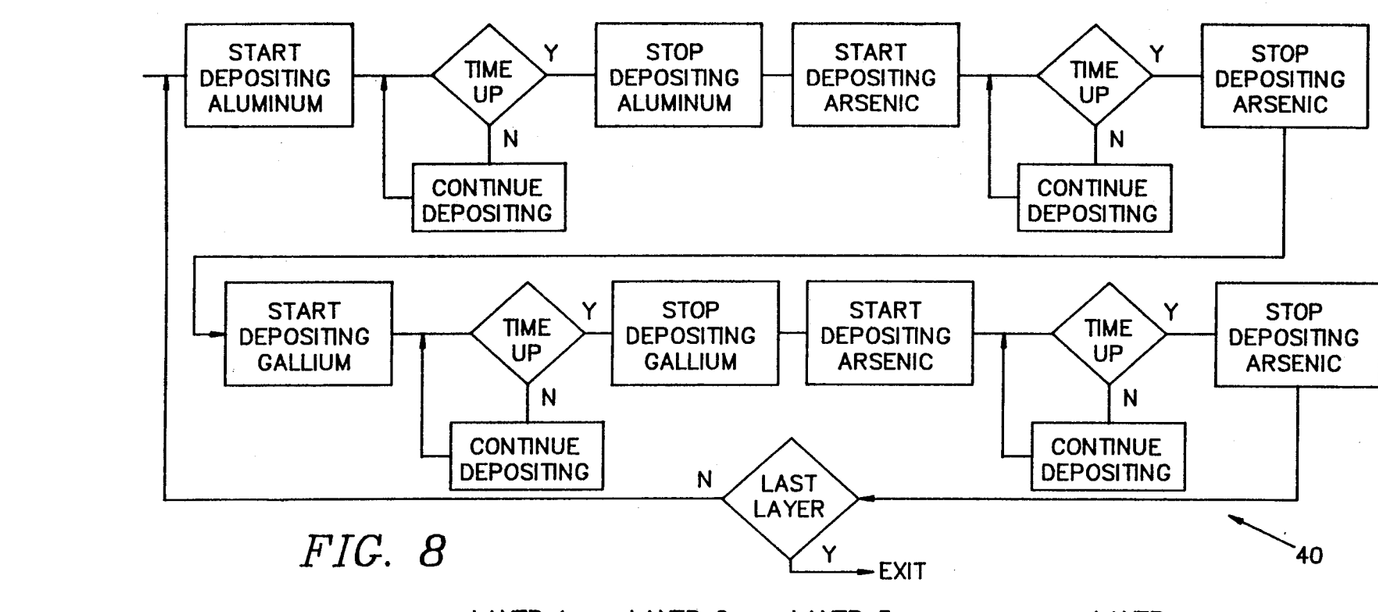
FIG. 8 is a logic flowchart showing logic for incorporation into the system control logic of the apparatus of FIG. 7 for accomplishing one method of the present invention for growing AlAs/GaAs superlattice structures.
Figure 9:
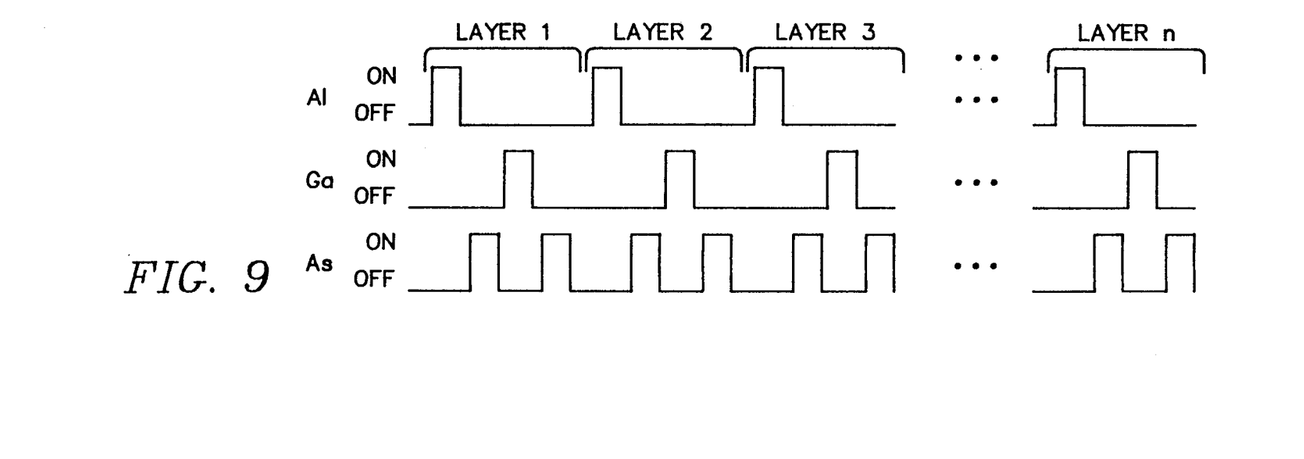
FIG. 9 is a timing diagram showing the control signals employed in the apparatus of FIG. 7 accomplished by the logic of FIG. 8.

The first approach is depicted in FIGS. 8 and 9. The logic 40 first opens the appropriate valve 38 to cause Al to be deposited on the steps 12 of the substrate 10 by the beam 34. The Al atoms nucleate adjacent the step edges 16 and bond to one another forming a monolayer 26 extending outward along the width of each step 12 from the edge 16 of the next higher step 12 in an amount determined by the quantity of Al deposited. As indicated by the decision blocks in FIG. 8, the logic 40 is pre-programmed in each case with the amount of time that Al, Ga, and As are to be deposited to achieve the desired structural geometry being created. After the Al of monolayer 26 is deposited, the Al source is turned off and the As source is opened for the time required to create the desired monolayer 26 of AlAs. This process is then repeated to form the monolayer 28 of GaAs adjacent the edge 20 of the first monolayer 26 by first depositing Ga for the proper time and then once again opening the source of As to deposit the proper amount of As. The logic 40 then tests to see if the preprogrammed number of layers have been formed. If they have, the logic 40 exits. If not, it returns to the beginning of the loop to form another layer in the manner described above.

Figure 10:
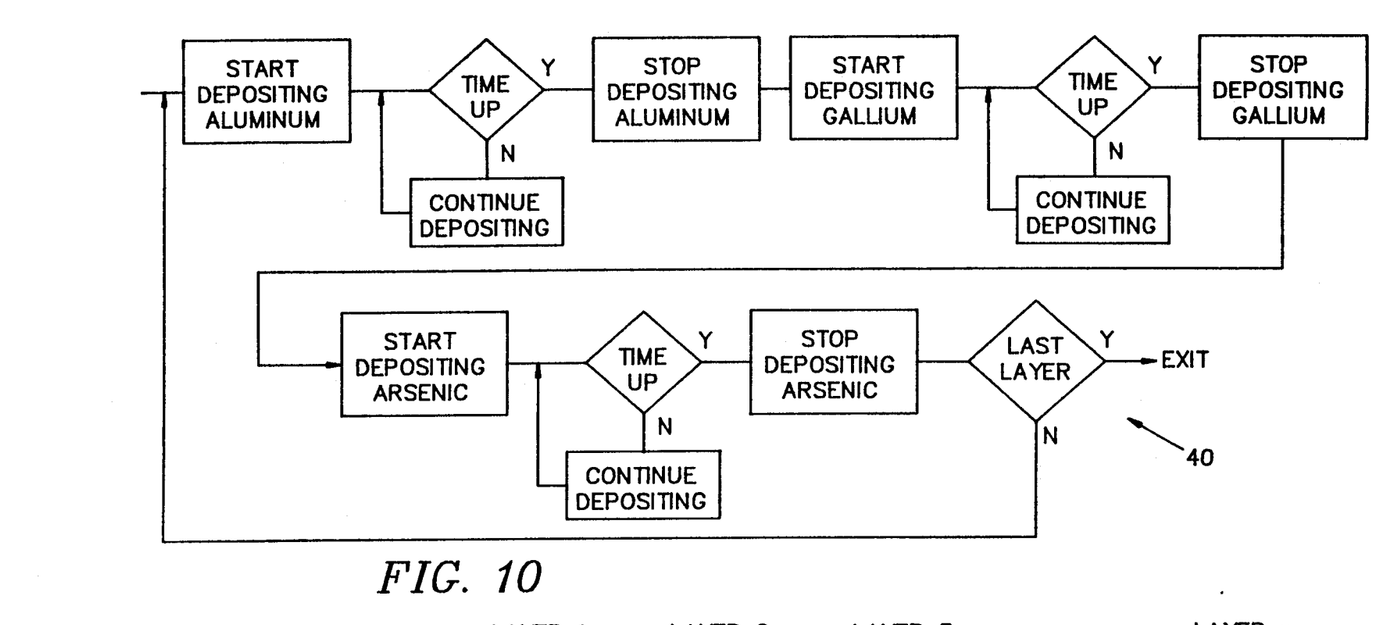
FIG. 10 is a logic flowchart showing logic for incorporation into the system control logic of the apparatus of FIG. 7 for accomplishing another method of the present invention for growing AlAs/GaAs superlattice structures.
Figure 11:
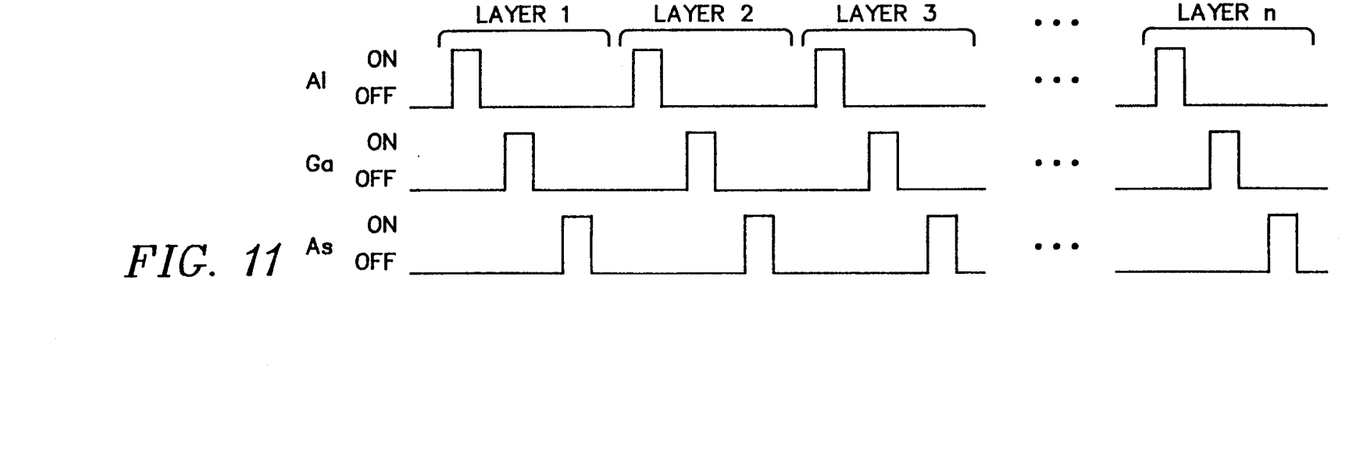
FIG. 11 is a timing diagram showing the control signals employed in the apparatus of FIG. 7 accomplished by the logic of FIG. 10.

The second approach is shown in FIGS. 10 and 11. In this case, an Al monolayer 26 is formed followed by the formation of an adjacent Ga monolayer 28. Both the Al and Ga are then simultaneously bombarded with As atoms by the beam 34 to form the desired AlAs and GaAs at the same time.

Figure 12:
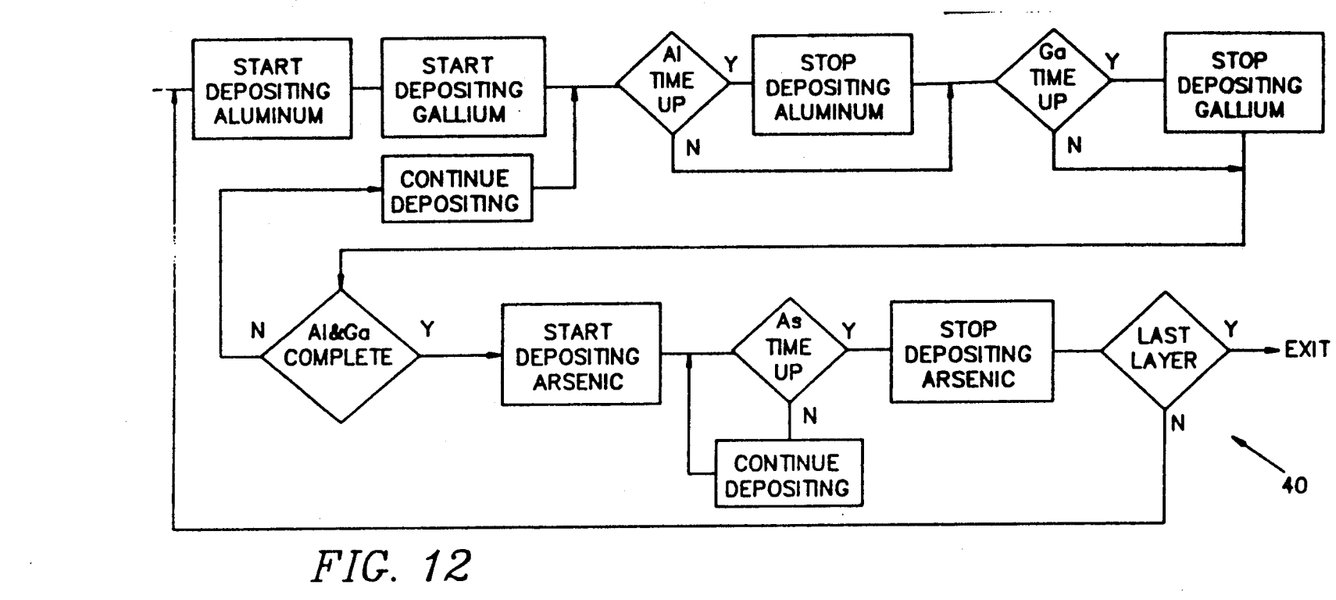
FIG. 12 is a logic flowchart showing logic for incorporation into the system control logic of the apparatus of FIG. 7 for accomplishing the preferred method of the present invention for growing AlAs/GaAs superlattice structures.
Figure 13:
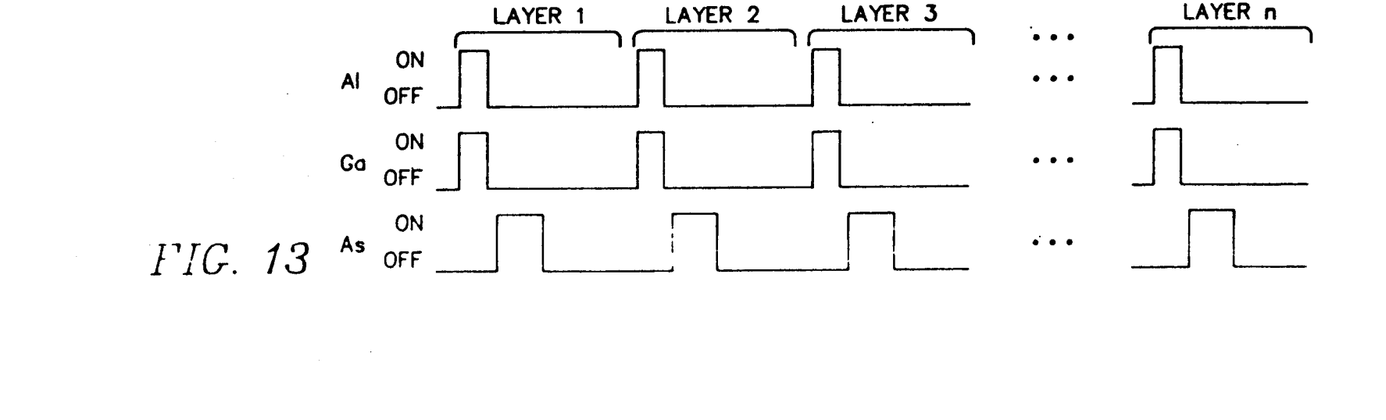
FIG. 13 is a timing diagram showing the control signals employed in the apparatus of FIG. 7 accomplished by the logic of FIG. 12.

The third and preferred approach is shown in FIGS. 12 and 13. This approach is based on the observed phenomenon of FIGS. 5 and 6. In the prior approaches, it should be realized and appreciated that the beam 34 only contained one material at a time. In this approach, the logic 40 starts by bombarding the substrate 10 with a combined atomic beam 34 containing both Al and Ga. The valve 38 for each is kept open for the pre-established time for that component and then closed. As the Al and Ga atoms arrive at the steps 12, they migrate, nucleate and bond in the manner shown in simplified form in FIGS. 5 and 6; thus, the Al forms its desired monolayer 26 adjacent the edge 16 of the next higher step 12 and the Ga forms its monolayer 28 adjacent the edge 20 of the Al. When the depositing of the Al and Ga is complete for a layer, the logic 40 then deposits the As in the manner described for the second approach above. Having thus described the methods and apparatus of the present invention in general and in simplified terms, the invention will be described in greater technical detail by reference to tested embodiments of the inventors herein.

The requirement of the existence of a periodic array of monoatomic surface steps was found by the inventors to be crucial to the success of this invention. In the methods and procedures developed by the inventors to achieve their objectives as reflected by functional blocks 42, 44 and 46 of FIG. 7 (i.e. substrate preparation, substrate analysis, and deposition analysis, respectively), the steps are introduced by carefully polishing a substrate by a few degrees from a major crystallographic plane. The misorientation direction is chosen to favor a direction which will result in step edges as straight as possible. In the case of MBE growth of GaAs and AlAs on a {001} GaAs substrate, this direction was found to be orthogonal to the {110} plane, i.e. the step edges are terminated by Arsenic dangling bonds since the chosen substrate is GaAs. The regularity of the step periodicity is found from analysis of the superlattice Reflection High Energy Electron Diffraction (RHEED) diffraction spots associated with the steps. The steps are rendered more periodic by depositing a GaAs buffer layer at a temperature corresponding to the disappearance of the RHEED oscillations. The straightness of the steps controls the interface roughness and is established by minimizing the kink density along the step edges. This is done by choosing the growth temperature that gives the narrowest RHEED spots for the beam direction parallel to the step edges. This temperature ($\sim 610°$ C.) yields the narrowest and shortest step superlattice spots. The step period is adjusted by proper choice of the misorientation angle from a few tens to a few hundred angstroms (Å).

The fraction of monolayers of elements to be deposited are estimated with an accuracy of a few percent from the RHEED oscillations that are obtained during epitaxy of the elements being deposited. The RHEED oscillations give the times, $t1$ and $t2$, taken for the deposition of a monolayer of each of two elements. The times required for deposition of m and n fractional monolayers are taken as mt1 and nt2. These, of course, are the parameters used to pre-establish the times employed in the logic 40 as described above.

A layer growth mode is insured by growing at a sufficiently high temperature, $T_C$, to allow fast migration of the atoms to the nearest nucleation sites, i.e. the step edges. The rapid atom migration required is achieved by depositing in the Atomic Layer Epitaxial (ALE) mode. In this mode, the deposition of Al and Ga, for example, is taking place while the As shutter of the MBE system is closed. Note that an additional time (0.3 second in tested embodiments) for Al and Ga atom migration is also allowed after each deposition cycle before opening the As shutter. While not shown in the simplified logic flowcharts of FIGS. 8, 10 and 12, this delay between the deposition cycles should be included in a preferred implementation of the present invention. At the temperature $T_C$, the RHEED oscillations should also disappear. This necessary condition establishes that all step edges are moving in phase during growth. The inventors found this optimal temperature ($T_C$) to be ~625° C. in their MBE system.

EXTENSIONS OF THE SUPERLATTICE CONCEPTS OF 2D CRYSTAL ARCHITECTURE AND STRAIN LAYER TILTED SUPERLATTICES

As mentioned earlier herein, in developing their novel methods and apparatus to successfully implement the basic superlattice concepts of the '899 patent beyond the "paper patent" state, the inventors also developed several new and novel superlattices. Those will now be described.

1. Growth of ternary compound semiconductor tilted superlattices

Figure 14:
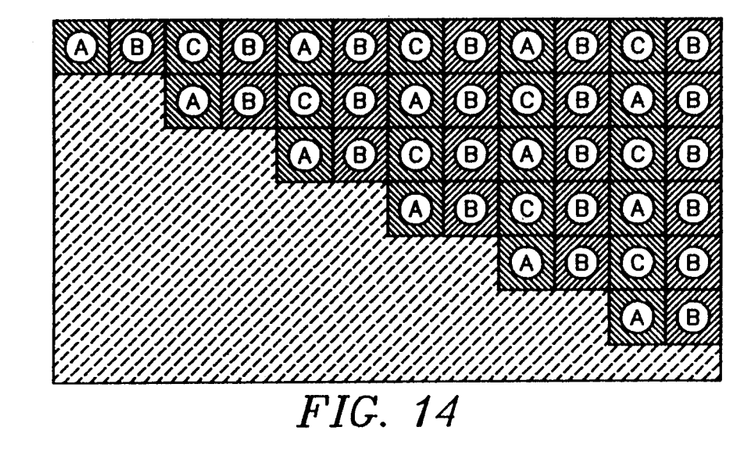
FIG. 14 is a simplified drawing of a tilted superlattice with two or three compounds according to the present invention.

In a first instance, it was the inventors' intent to create pseudo ternary semiconductor alloys out of the deposition of two binary compound semiconductor alloys using the concept of the tilted superlattice deposition. This is illustrated in FIG. 14. In the simple case of half monolayer deposition of elements A and B, the deposition sequence ABABABAB . . . will yield the standard tilted superlattice of the '899 patent. The deposition sequence ABAAABAAAB . . . will yield the (AB ternary, A binary) structure shown in FIG. 14 (replace C by A in this Figure to visualize this structure). The concept is easily extended to the deposition of more complex ternary materials from the deposition of fractional monolayers of three ternary elements A, B, and C. The deposition sequences can result in AC-B or AC-BC or AC-AB tilted superlattices with the appropriate sequences. The inventors have experimentally demonstrated this concept with the deposition of GaAs-AlAs half monolayers and found that a $Ga_{0.5}Al_{0.5}As$-GaAs tilted superlattice could be produced in this manner. For example, employing the deposition sequence ABAAABAAAB . . . will yield an AB ternary, A binary structure; employing the deposition sequence ABCBABCBABC . . . yields an AC ternary, B binary structure; employing the deposition sequence ABAAABAAAB . . . yields an AB ternary, A binary structure; employing the deposition sequence ABCCABCCABC . . . yields an AC ternary, BC binary structure; employing the deposition sequence ABCAABCAABC . . . yields an AC ternary, AB binary structure; and employing the deposition sequence ABAAABAAAB . . . yields an AB ternary, A binary structure.

2. Growth of quantum wire superlattices with 2D carrier confinements

Figure 15:
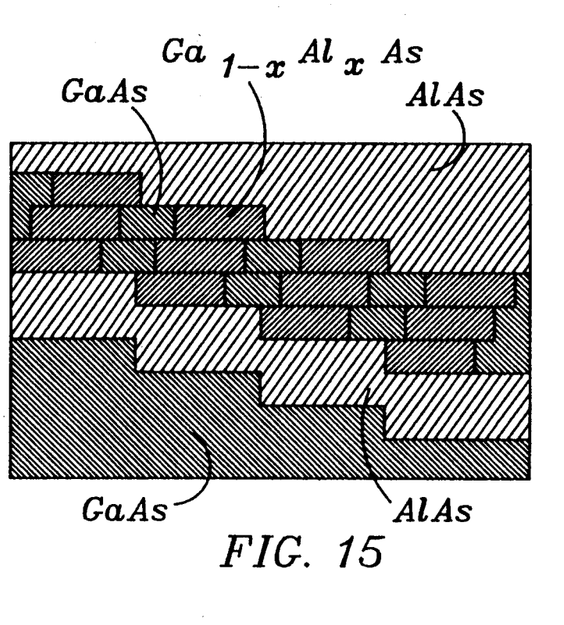
FIG. 15 is a simplified drawing of a quantum well wire superlattice according to the present invention.

While the forming of quantum wire-containing superlattices was postulated in the '889 patent and are depicted in FIG. 5 thereof, the inventors herein have built and tested a quantum wire superlattice having the geometry illustrated in FIG. 15 hereof which is practical and patentably distinct over the never-built conceptual design of the '889 patent. Specifically, the inventors herein found that a practical quantum wire superlattice could be grown directly by sandwiching a thin tilted superlattice (TSL) layer between two wider band gap layers of AlAs as illustrated in FIG. 15. Such structures have been built and tested by the inventors and have demonstrated unique quantum wire effects associated with 2 dimensional carrier confinement.

3. Tilted superlattices with misfit strain

As is well known in the art, lattice mismatch and thermal differential expansion between the epitaxial layers and the substrate have been a main obstacle to the use of a wide variety of compound semiconductors. In other words, while the desired geometries can be created, they tend to self-destruct because of different thermal expansion qualities of the compounds employed causing the epitaxial layers to delaminate and separate from the substrate. In fact, the need for low defect densities of the epitaxial layers actually limits their choice to a few lattice matched substrate materials. One is then forced to use quaternary compounds to achieve both lattice matching conditions and the desired band gap for the epitaxial layer. TSLs offer a potentially important alternative solution to this problem. As illustrated in FIG. 14, the use of three binary compounds allows one to produce a pseudo-ternary compound in a direction parallel to the substrate normal, while a TSL produces the desired band gap in a direction parallel to the substrate surface. For example, the layer, $$-(A)_m(B)_n(C)_m(B)_n-$$

may be viewed as a TSL of the type (AC)m-(B)n if $m+n \sim 1$. Its lattice parameters $a_{AC}$ and $a_B$ are those of the pseudo ternary alloy AC and of a binary alloy B. The misfit strain, in the simple case corresponding to $m+n+1$ is:

$$\epsilon = m\epsilon_{AC} + n\epsilon_B = \frac{ma_{AC} + na_B}{a_s} - 1$$

where $a_s$ is the substrate lattice parameter.

Lattice matching conditions may be achieved by adjusting m and/or n if the AC layers are in compression and the B layer is in tension. The case of an InP substrate with layers of InGaAs or InAs and GaAs could satisfy the above equation with a zero misfit strain for a range of effective band gaps of the InGaAs quantum well layers. Exact lattice matching conditions exist for:

$$m_1 = \frac{a_S - a_{AC}}{a_B - a_{AC}}; \quad n_1 = \frac{a_B - a_S}{a_B - a_{AC}}$$

and $a_{AC} > a_S > a_B$. The TSL effective band gap may be adjusted by choosing the substrate tilt angle while maintaining a zero misfit strain in the structure. The width of the quantum well is given by:

$$w = \frac{m_1 a_S}{\tan \alpha}$$

where $\alpha$ is the tilt angle.

It should also be noted here that in this case, the substrate will be unstrained at all times and thus the island nucleation regime could be avoided more easily than in the growth of conventional strained layer superlattices.

4. Naturally grown tilted superlattices of coherent tilted superlattices

The inventors herein have realized tilted and vertical superlattices in a completely novel way, as described above, by co-deposition of Al and Ga on a vicinal surface (misoriented by 1° or 2° from the main {100} crystallographic orientation. Specifically, they have achieved a tilted superlattice by growing under the following conditions.

(a) The number of Al and Ga atoms deposited with the Arsenic flux "off" should be equal to the number of surface lattice sites. For this reason, the inventors choose to call this type of tilted superlattice a Coherent Tilted Superlattice (CTSL).

(b) The growth temperature should be above the critical temperature which corresponds to the disappearance of RHEED oscillations (~610° C.).

(c) The Al and Ga co-deposition should be taking place with the As flux shut off from the substrate.

The inventors have found that the tilt of the Tilted Superlattice will be controlled by the tilt parameter p. In the case of the naturally grown CTSL, the tilt parameter corresponds to p=m+n, where m and n are the fraction of Al and Ga monolayers co-deposited during each cycle. This new mode of deposition which permits the deposition of naturally tilted superlattices has been designated by the inventors as CTSL deposition. CTSL deposition requires that the number of atoms deposited per cycle is equal to the number of surface sites. In addition, it requires a surface with a monoatomic periodic step array.

5. Device implications

Figure 16:
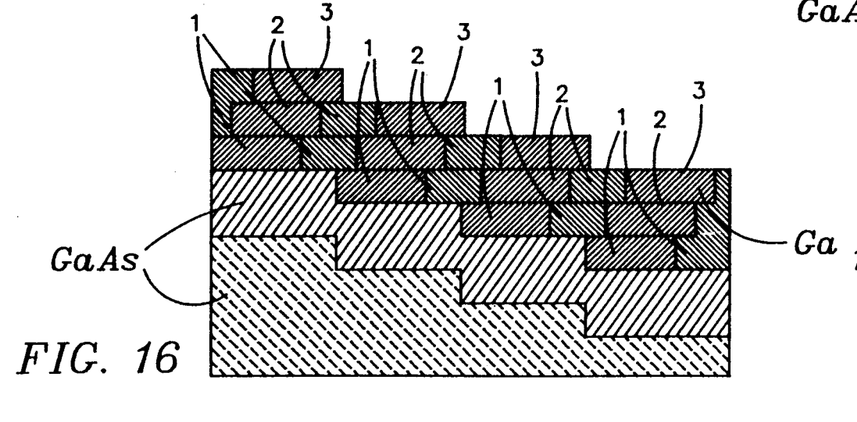
FIG. 16 is a simplified drawing of a coherent tilted superlattice according to the present invention.

With the Tilted Superlattice and the Coherent Tilted Superlattice, the inventors herein have provided two means of modulating the materials' band gap in a direction parallel to the surface. With a CTSL in which doping has been introduced as shown in FIG. 16, one can introduce a modulation of the conductivity in a 2 dimensional electron gas by imposing additional carrier confinement with the CTSL in a direction normal to the figure. This will allow the building of a one dimensional electron gas at the GaAs-CTSL interface. Field effect transistors (FETs) build with this type of structure are expected to exhibit superior characteristics (transconductance) and perform as very high mobility devices. The CTSL should be part of the FET gate while the source and drain should be along the direction perpendicular to the figure.

The CTSL can also be used to advantage as a way of fabricating a quantum wire laser. These types of lasers are expected to exhibit low threshold currents. The active layer of these layers will be a GaAs quantum well while the cladding barrier layers will be composed of a CTSL.

Note that the CTSL deposition as described above demonstrates the possibility of producing a self-organizing system with semiconductor alloys. The period of the CTSL is adjusted either with the alloy composition or the substrate tilt angle. This self-organizing system may be realized with a number of semiconductor alloys (e.g., In, GaAs, InSb, Ga) and metal alloys. The central requirement to produce the CTSL form of a self-organizing system is the presence of a periodic array of monoatomic steps.

Wherefore, having thus described the present invention, what is claimed is:

1. The method for growing a superlattice structure on a substrate comprising the steps of:
   (a) creating a periodic array of monoatomic surface steps on the substrate comprised of a plurality of equal and adjacent monoatomically thick steps on the surface of the substrate at an area to have the superlattice structure grown thereon wherein each step contains a plurality of atomic bonding sites on the surface thereof;
   (b) providing means for creating a beam of a material being input thereto and control means operably connected for selectively including or not including respective ones of a plurality of materials within the beam;
   (c) directing the beam at the steps of the substrate;
   (d) establishing time periods for deposition of the materials for each of the monolayers such that the total number of atoms of the materials deposited will be equal in number to the number of the atomic bonding sites; and
   (e) causing the control means to include and not include respective ones of the materials within the beam in a pre-established pattern of the time periods from step (d) which will cause the materials to be deposited on the steps in a series of stacked monolayers.

2. The method of growing a superlattice structure on a substrate of claim 1 wherein said step of creating a periodic array of monoatomic surface steps on the substrate includes the step of:
   carefully polishing the substrate by a few degrees from a major cyrstallographic plane thereof.

3. The method for growing a superlattice structure on a substrate of claim 2 wherein said step of polishing the substrate includes the step of:
   polishing the substrate in a misorientation direction chosen to result in step edges as straight as possible.

4. The method for growing a superlattice structure on a substrate of claim 3 wherein the substrate is GaAs and:
   the misorientation direction is chosen to be orthogonal to the {110} direction of the substrate whereby the edges of the steps are terminated by Arsenic dangling bonds.

5. The method for growing a superlattice structure on a substrate of claim 1 and additionally comprising the step of:
   making the steps more periodic by depositing a GaAs buffer layer at a temperature corresponding to the disappearance of oscillations of RHEED diffraction spots associated with the steps.

6. The method for growing a superlattice structure on a substrate of claim 1 and additionally comprising the step of:
   maximizing the straightness of the steps and thereby controlling interface roughness by minimizing kink density along the edges of the steps by employing a growth temperature in combination with the beam that gives the narrowest RHEED spots associated with the steps for the beam direction parallel to edges of the steps.

7. The method for growing a superlattice structure on a substrate of claim 6 wherein said step of employing a growth temperature includes the step of:
   setting the growth temperature to approximately 610° C.

8. The method for growing a superlattice structure on a substrate of claim 1 with two elements and additionally including the steps of:
   (a) measuring the fraction of monolayers of the elements to be deposited from RHEED oscillations obtained during prior epitaxy of the elements to determine the times, t1 and t2, taken for the deposition of a monolayer of each of two elements;
   (b) using the times t1 and t2 to establish the times mt1 and nt2 required for deposition of m and n fractional monolayers; and,
   (c) using the times mt1 and nt2 as the times for deposition of the two elements for each monolayer.

9. The method for growing a superlattice structure on a substrate of claim 8 and additionally including the step of:
   employing a sufficiently high temperature in combination with the beam to establish a layer growth mode and allow fast migration of atoms of the materials to nearest nucleation sites being edges of the steps.

10. The method for growing a superlattice structure on a substrate of claim 9 wherein each monolayer is comprised of two materials and said step of causing the control means to include and not include respective ones of the materials within the beam in a pre-established pattern of time periods includes:
    establishing the time periods for each of the materials of each monolayer such that the total amount of the materials deposited is wider than the width of a step whereby the monolayers tilt from being normal to the substrate as they are stacked.

11. The method for growing a superlattice structure on a substrate by depositing elements thereon in a stacked series of monolayers comprising the steps of:
    (a) creating a periodic array of monoatomic surface steps on the substrate comprised of a plurality of equal and adjacent monoatomically thick steps on the surface of the substrate at an area to have the superlattice structure grown thereon wherein each step contains a plurality of atomic bonding sites on the surface thereof;
    (b) providing means for creating a beam containing the elements to be deposited and control means operably connected for selectively including or not including respective ones of the elements within the beam;
    (c) establishing time periods for deposition of the elements for each of the monolayers such that the total number of atoms of the elements deposited will be equal in number to the number of the atomic bonding sites;
    (d) directing the beam at the steps of the substrate; and,
    (e) causing the control means to include and not include respective ones of the elements within the beam in a pre-established pattern of the time periods from step (c) which will cause the elements to be deposited on the steps in a series of stacked monolayers whereby a Coherent Superlattice (CSL) is formed.

12. The method for growing a superlattice structure on a substrate of claim 11 wherein Al, Ga, and As are to be deposited on a substrate to form stacked monolayers of AlAs and GaAs and said step of causing the control means to include and not include respective ones of the elements within the beam in a pre-established pattern of time periods includes the steps of:
    (a) first depositing sufficient atoms of Al to form an Al monolayer;
    (b) next depositing sufficient atoms of As to combine with the Al monolayer to form an AlAs monolayer;
    (c) then depositing sufficient atoms of Ga to form a Ga monolayer adjacent the Al monolayer;
    (d) next depositing sufficient atoms of As to combine with the Ga monolayer to form a GaAs monolayer; and,
    (e) repeating steps (a) through (d) until the desired thickness of stacked monolayers has been grown.

13. The method for growing a superlattice structure on a substrate of claim 11 wherein Al, Ga, and As are to be deposited on a substrate to form stacked monolayers of AlAs and GaAs and said step of causing the control means to include and not include respective ones of the elements within the beam in a pre-established pattern of time periods includes the steps of:
    (a) first depositing sufficient atoms of Al to form an Al monolayer;
    (b) then depositing sufficient atoms of Ga to form a Ga monolayer adjacent the Al monolayer;
    (c) next depositing sufficient atoms of As to combine with the Al and Ga monolayers to form AlAs and GaAs monolayers; and
    (d) repeating steps (a) through (c) until the desired thickness of stacked monolayers has been grown.

14. The method for growing a superlattice structure on a substrate of claim 11 wherein Al, Ga, and As are to be deposited on a substrate to form stacked monolayers of AlAs and GaAs and said step of causing the control means to include and not include respective ones of the elements within the beam in a pre-established pattern of time periods includes the steps of:
    (a) starting the simultaneous depositing of Al and Ga atom to form adjacent Al and Ga monolayers;
    (b) stopping the depositing of Al when sufficient atoms of Al have been deposited to form the desired Al monolayer;
    (c) stopping the depositing of Ga when sufficient atoms of Ga have been deposited to form the desired Ga monolayer;
    (d) next depositing sufficient atoms of As to combine with the Al and Ga monolayers to form AlAs and GaAs monolayers; and,
    (e) repeating steps (a) through (d) until the desired thickness of stacked monolayers have been grown.

15. The method for growing a superlattice structure on a substrate of claim 14 and additionally comprising between steps (c) and (d) thereof the step of:
    delaying for a period of time sufficient to allow Al and Ga atom migration within each of the monolayers.

16. The method for growing a superlattice structure on a substrate of claim 15 wherein:
    said period of time for delay is approximately 0.3 second.

17. The method for growing a superlattice structure on a substrate of claim 14 wherein:
said steps are accomplished during the simultaneous step of controlling the temperature of the environment of the substrate at a temperature TC wherein RHEED oscillations associated with the superlattice being formed disappear whereby all step edges being formed are moving in phase during growth.

18. The method for growing a superlattice structure on a substrate of claim 17 wherein:
said step of controlling the temperature of the environment comprises controlling the temperature (TC) to be approximately ∼625° C.

19. The method for growing a superlattice structure on a substrate of claim 11 wherein there are a pair of monolayer formed by a pair of elements A and B on each step and additionally comprising the step of:
making the width m of element A plus the width n of element B less than or equal to the width p of the step whereby the stacked monolayers form layers of elements A and B which are normal to the substrate.

20. The method for growing a superlattice structure on a substrate of claim 19 wherein each step contains a plurality of atomic bonding sites on the surface thereof and additionally including the step of:
depositing a total number of atoms of the elements A and B equal in number to the number of the atomic bonding sites whereby a Coherent Superlattice (CSL) is formed.

21. The method for growing a superlattice structure on a substrate of claim 11 wherein there are a pair of monolayer formed by a pair of elements A and B on each step and additionally comprising the step of:
making the width m of element A plus the width n of element B greater than the width p of the step whereby the stacked monolayers form layers of elements A and B which are tilted from being normal to the substrate.

22. The method for growing a superlattice structure on a substrate of claim 21 and additionally including the step of:
creating pseudo ternary semiconductors alloys as part of the CTSL by employing at least two binary compound semiconductors alloys in the deposition process.

23. The method of growing a superlattice structure on a substrate of claim 22 wherein said step of employing at least two binary compound semiconductor alloys in the deposition process comprises the steps of:
(a) choosing two elements A and B for the deposition process; and,
(b) employing the deposition sequence ABAAABAAAB . . . to yield an AB ternary, A binary structure.

24. The method for growing a superlattice structure on a substrate of claim 22 wherein said step of employing at least two binary compound semiconductor alloys in the deposition process comprises the steps of:
(a) choosing three elements A, B, and C for the deposition process; and,
(b) employing the deposition sequence ABCBABCBABC . . . to yield an Ac ternary, B binary structure.

25. The method for growing a superlattice structure on a substrate of claim 22 wherein said step of employing at least two binary compound semiconductor alloys in the deposition process comprises the steps of:
(a) choosing three elements A, B, and C for the deposition process; and,
(b) employing the deposition sequence ABAAABAAAB . . . to yield an AB ternary, A binary structure.

26. The method for growing a superlattice structure on a substrate of claim 22 wherein said step of employing at least two binary compound semiconductor alloys in the deposition process comprises the steps of:
(a) choosing three elements A, B, and C for the deposition process; and,
(b) employing the deposition sequence ABCCABCCABC . . . to yield an AC ternary, BC binary structure.

27. The method for growing a superlattice structure on a substrate of claim 22 wherein said step of employing at least two binary compound semiconductor alloys in the deposition process comprising the steps of:
(a) choosing three elements A, B, and C for the deposition process; and,
(b) employing the deposition sequence ABCAABCAABC . . . to yield an AC ternary, AB binary structure.

28. The method for growing a superlattice structure on a substrate of claim 22 wherein said step of employing at least two binary compound semiconductor alloys in the deposition process comprises the steps of:
(a) choosing two elements A and B for the deposition process; and,
(b) employing the deposition sequence ABAAABAAAB . . . to yield an AB ternary, A binary structure.

29. The method for growing a superlattice structure on a substrate of claim 21 and additionally including the step of:
creating a quantum wire superlattice by sandwiching a thin tilted superlattice (TSL) layer between two wider band gap layers.

30. The method for growing a superlattice structure on a substrate of claim 25 and additionally including the step of:
creating a tilted superlattice with misfit strain by using three binary compounds to produce a pseudo-ternary compound in a direction parallel to the substrate normal while the tilted superlattice structure provides a desired band gap in a direction parallel to the substrate surface.

31. The method for growing a superlattice structure on a substrate of claim 25 and additionally including the step of:
forming the CTSL as part of a field effect transistor (FET) wherein the TSL is part of the FET gate.

32. The method for growing a superlattice structure on a substrate of claim 25 and additionally including the step of:
forming the CTSL as the cladding layers of a quantum wire laser having a GaAs active layer.

33. The method for producing a self-organizing system with semiconductor alloys comprising the steps of:
(a) creating a periodic array of monoatomic surface steps on a substrate comprised of a plurality of equal and adjacent monoatomically thick steps on the surface of the substrate at an area to have a self-organizing superlattice structure grown thereon wherein each step contains a plurality of atomic bonding sites on the surface thereof;
(b) providing means for creating a beam of a material being input thereto and control means operably connected for selectively including or not including respective ones of a plurality of semiconductor materials to be alloyed within the beam;
(c) directing the beam at the steps of the substrate;
(d) causing the control means to include and not include respective ones of the semiconductor materials within the beam in a pre-established pattern of time periods which will cause the materials to be deposited on the steps in a series of self-organizing stacked monolayers; and,
(e) establishing the time periods for deposition of the materials for each of the monolayers such that the total number of atoms of the materials deposited is equal in number to the number of the atomic bonding sites whereby a self-organizing, coherent, tilted, superlattice structure is formed.

* * * * *